(12) United States Patent
Lin et al.

(10) Patent No.: US 11,610,978 B2
(45) Date of Patent: Mar. 21, 2023

(54) LDMOS WITH AN IMPROVED BREAKDOWN PERFORMANCE

(71) Applicant: NXP B.V., Eindhoven (NL)

(72) Inventors: Xin Lin, Phoenix, AZ (US); Ronghua Zhu, Chandler, AZ (US); Zhihong Zhang, Chandler, AZ (US); Yujing Wu, Chandler, AZ (US); Pete Rodriquez, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 22 days.

(21) Appl. No.: 17/199,153

(22) Filed: Mar. 11, 2021

(65) Prior Publication Data

US 2022/0293771 A1  Sep. 15, 2022

(51) Int. Cl.
| | | |
|---|---|---|
| H01L 29/66 | (2006.01) | |
| H01L 21/8234 | (2006.01) | |
| H01L 29/06 | (2006.01) | |
| H01L 21/762 | (2006.01) | |
| H01L 29/40 | (2006.01) | |
| H01L 29/423 | (2006.01) | |
| H01L 29/08 | (2006.01) | |
| H01L 29/78 | (2006.01) | |
| H01L 27/02 | (2006.01) | |
| H01L 29/786 | (2006.01) | |

(52) U.S. Cl.
CPC ........... *H01L 29/66681* (2013.01); *H01L 21/823418* (2013.01); *H01L 21/823481* (2013.01); *H01L 29/0653* (2013.01); *H01L 29/7816* (2013.01)

(58) Field of Classification Search
CPC . H01L 29/0873–0886; H01L 29/66696; H01L 29/66727; H01L 29/41741; H01L 29/7823; H01L 29/7824; H01L 29/402; H01L 29/404; H01L 29/405; H01L 29/408; H01L 29/41; H01L 29/41725; H01L 29/41758; H01L 29/0611; H01L 29/66098; H01L 29/7424; H01L 29/7808; H01L 29/7821; H01L 29/0649–0661; H01L 29/66712; H01L 29/7802; H01L 29/66681; H01L 29/7816
See application file for complete search history.

(56) References Cited

U.S. PATENT DOCUMENTS

| | | |
|---|---|---|
| 5,534,721 A | 7/1996 | Shibib |
| 8,507,985 B2 * | 8/2013 | Hirasozu ............ H01L 29/0873 257/E29.256 |
| 9,543,379 B2 | 1/2017 | Yang et al. |
| 9,899,513 B1 | 2/2018 | Lin et al. |
| 2011/0115018 A1 * | 5/2011 | McGregor ............ H01L 29/402 257/341 |

(Continued)

*Primary Examiner* — Sonya McCall-Shepard

(57) ABSTRACT

A method for manufacturing a semiconductor device includes forming a plate structure over an isolation region. A drain electrode electrically connected to a drift region underlying the isolation region is formed, wherein the drain electrode is separated from a first location of the plate structure by a first distance along a central axis of an active area of the semiconductor device in a direction of a current flow between a source and a drain of the semiconductor device, the drain electrode is separated from a second location of the plate structure by a second distance along a line parallel to the central axis and within the active area. The first distance is less than the second distance.

20 Claims, 11 Drawing Sheets

(56) References Cited

U.S. PATENT DOCUMENTS

| | | |
|---|---|---|
| 2012/0098062 A1 | 4/2012 | Pendharkar et al. |
| 2014/0264581 A1 | 9/2014 | Chan et al. |
| 2017/0062608 A1 | 3/2017 | Mori |
| 2019/0288063 A1 | 9/2019 | Komatsu et al. |

* cited by examiner

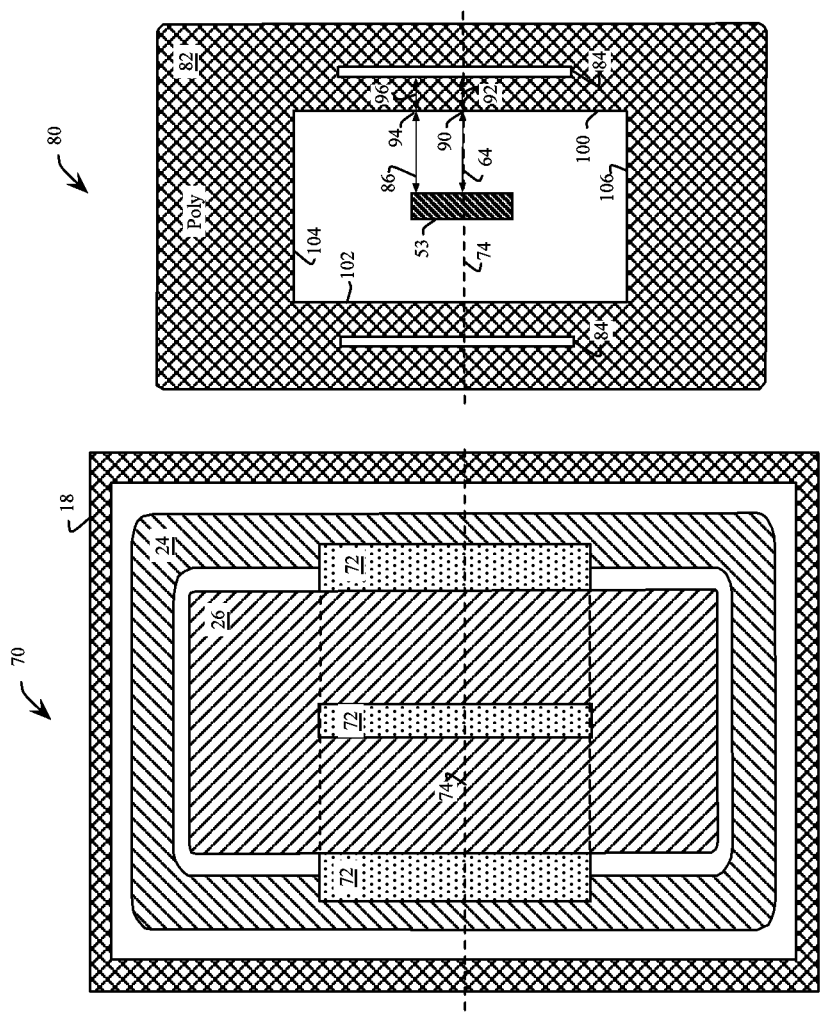

US 11,610,978 B2

LDMOS WITH AN IMPROVED BREAKDOWN PERFORMANCE

FIELD

This disclosure relates generally to a manufacturing process for a high voltage semiconductor device.

BACKGROUND

Smart Power technologies have had increasing demands in automotive, industrial and consumer applications. Integrating high voltage devices with high side capability onto an advanced CMOS platform is both technically and economically challenging. To prevent damage from the effects of electrostatic discharge (ESD) in many applications, the integrated high voltage devices are typically protected by ESD clamps, which are triggered above the operating voltage and below the device breakdown voltage. Therefore, achieving a sufficient breakdown voltage with a tight distribution is essential to the success of the ESD protection.

In some circumstances, the Breakdown Voltage (BV) of conventional high voltage devices decreases as the device width of these devices is decreased. Moreover, the BV variation of these narrow devices may also increase. Thus, providing adequate ESD protection becomes more challenging as the dimensions of high voltage devices are reduced to achieve certain design goals. Increasing the minimum device width of the high voltage device will improve the BV characteristics. However, a larger minimum device width will result in some disadvantageous characteristics, (e.g., a higher sense current when the high voltage device is used as a sense FET and a larger parasitic capacitance to the substrate). Therefore, it is highly desirable to improve breakdown performance through innovative device design while maintaining a minimum device width.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 2 is a plan view of a subset of layers of the example embodiment of FIG. 1.

FIG. 3 is a plan view of a polysilicon (poly) layer and a drain region of the example embodiment of FIG. 1.

DETAILED DESCRIPTION

Embodiments described herein provide for an improvement in BV. Specifically, a unique poly flap is used in a main device operation area, wherein the poly flap has a greater length (and hence shorter distance to the active drain area) than a gate length near the device termination ends. Accordingly, the BV dependence on the device width is reduced and the BV distribution is also narrowed, without requiring a wider device width with a corresponding increase in parasitic capacitance and higher sense currents in certain sensing applications.

Figure 1:
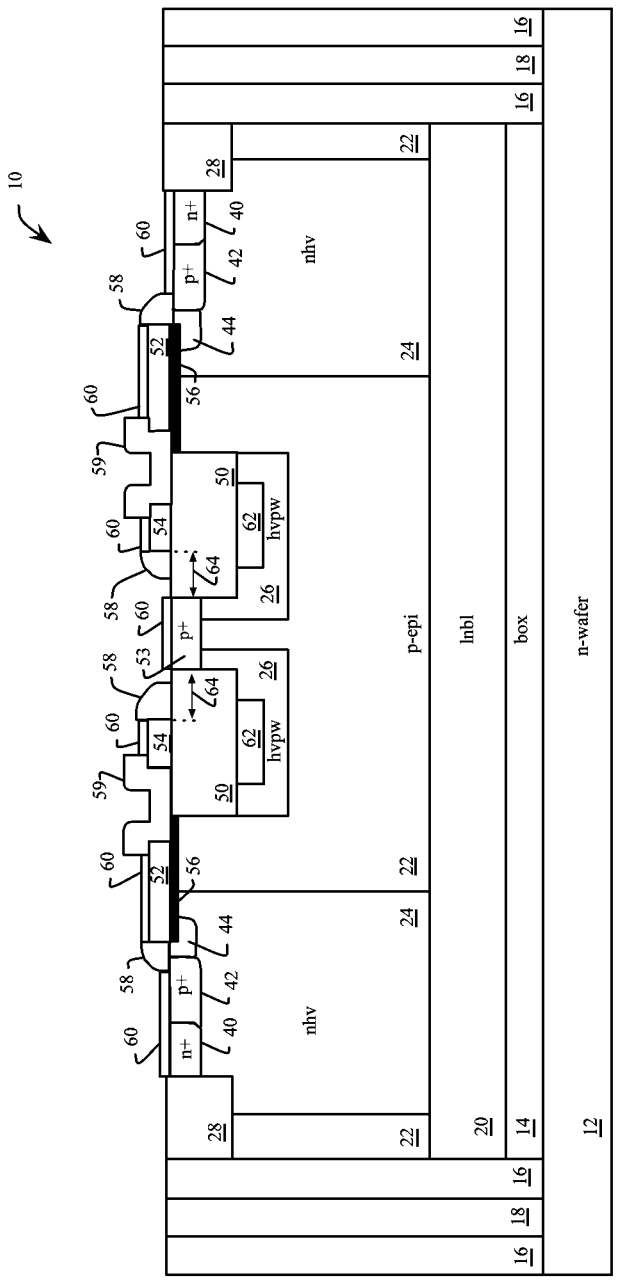
FIG. 1 is a cross-sectional view of an example embodiment of a p-type Laterally Diffused Metal Oxide Semiconductor (LDMOS).

FIG. 1 shows an example embodiment 10 of a p-type LDMOS arranged as a pair of split-gate transistors. The LDMOS is formed on an n-type wafer (e.g., an n-wafer) 12. A bulk oxide (e.g., box) 14 is formed on the n-wafer 12. An oxide 16 encloses a vertical n-type polysilicon 18. An n-type buried layer (e.g., lnbl) 20 is formed on the box 14. The box 14 and the oxide 16 form a shielded region, within which transistors are formed. A p-type epitaxial layer (e.g., p-epi) 22 is formed above the lnbl 20. N-type high voltage implants (e.g., nhv) 24 are formed over the lnbl 20 to form a respective body region for each of two transistors included in the embodiment 10. The p-type epitaxial layer 22 remains between the oxide 16 and the respective nhv 24. A pair of p-type high voltage p-wells (e.g., hvpw) 26 is formed in the p-epi 22. A Shallow Trench Isolation (STI) 28 is formed between a body contact 40 of each respective transistor and the deep trench isolation (DTI) formed by the oxide 16 and polysilicon 18. The body contact 40 forms a low impedance connection to the nhv 24. A source contact 42 abuts the body contact 40. A pair of p-type lightly doped drain implants (e.g., pldd) 44 are formed adjacent to the source contact 42. An STI 50 is formed in the hvpw 26 drift region for each respective transistor.

A first polysilicon gate electrode 52 is formed over a channel region 56 and controls the formation and conduction of the channel region 56. A shared drain 53 is formed in the hvpw 26 and the p-epi 22. A second polysilicon gate electrode 54 is formed over each of the STI 50 for each respective transistor to form a respective field plate. Each of the second polysilicon gate electrodes 54 form a respective field plate with the underlying drift region in the hvpw 26. A spacer 58 is formed laterally on the side of the first polysilicon gate electrode 52 which is close to the source 42 and on the side of the second polysilicon gate electrode 54 which is close to the drain 53. A spacer 59 is formed between each first polysilicon gate electrode 52 and the second polysilicon gate electrode 54. A silicide 60 is formed over the butted body contact 40 and source contact 42 for each respective transistor. The silicide 60 is also formed over each polysilicon gate electrode 52 and 54 and the shared drain 53. In another embodiment, the drift region in hvpw 26 further includes an n-type compensation (NCOM) region 62 to lower the doping concentration in this region. The second polysilicon gate electrode 54 is separated from the drain 53 by a first distance 64. The example embodiment 10 of FIG. 1 shows a split-gate design. It should be understood that the teachings throughout this disclosure also apply to an embodiment using a single poly gate design, wherein the single poly gate is used to form the channel region 56 as well as a field plate.

FIG. 2 is a plan view of an example embodiment 70 showing several processing layers of the embodiment 10 of FIG. 1. FIG. 3 is a plan view of an example embodiment 80 showing additional processing layers of the embodiment 10 of FIG. 1. FIG. 2 with continued reference to FIG. 1, shows the DTI 18 surrounding the nhv region 24, which forms the body region. The nhv region 24 surrounds the hvpw region 26, which forms the drift region. In one embodiment, the drift region further includes the implanted NCOM region 62 to improve Hot Carrier Injection (HCI)-Time Dependent Dielectric Breakdown (TDDB) robustness by lowering the doping concentration in the drift region. The DTI 18 and Box layer 14 (not shown) isolates the transistor pair from neighboring devices to improve isolation. A p-type epitaxial layer 22 (unfilled area in FIG. 2) between the DTI 18 and the nhv 24 further increases BV for both High-Side (HS) and Low-Side (LS) power applications. An active region 72 defined where channel conduction occurs. In the example embodiment 70, the active region 72 is shown as a single rectangular area. A central axis 74 is defined, which bisects the active area 72 in a direction of a current flow between the source 42 and the drain 53.

FIG. 3 with continued reference to FIG. 1 and FIG. 2, shows a merged polysilicon layer 82, which conductively merges the first gate electrode 52 (forming the poly gate over the channel region 56) and the second gate electrode 54 (forming a field plate over the STI 50) outside of the active area 72. A pair of gaps 84 are used to form the split-gate transistor by separating the first gate electrode 52 and the second gate electrode 54. The drain 53 is separated from the second polysilicon gate electrode 54 by the first distance 64 at a first location 90 on the central axis 74 of the active area 72. The second polysilicon gate electrode 54 includes a first field flap length 92 at the first location 90. The drain 53 is separated from the second polysilicon gate electrode 54 by a second distance 86 at a second location 94 distal from the central axis 74 and within the active area 72 of the example embodiment 10. The second polysilicon gate electrode 54 includes a second field flap length 96 at the second location 94.

Figure 4:
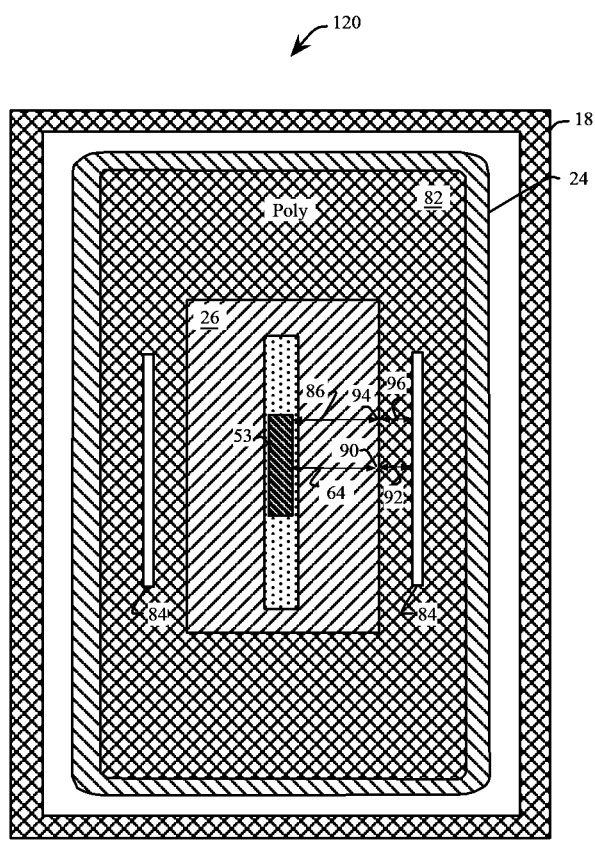
FIG. 4 is a top view of the layers of FIG. 2 and FIG. 3 corresponding to the example embodiment of FIG. 1.

The second gate electrode 54, overlaying the STI 50 in the hvpw 26, or drift region, includes a right-side portion 100, a left-side portion 102, a top portion 104 and a bottom portion 106. The terms right-side, left-side, top and bottom are provided in the context of FIG. 3 for ease of illustration and are not intended to confer an orientation limitation on the example embodiment 80. A charge balance proximal to the first location 90 is different than the charge balance at the device termination (e.g., proximal to the second location 94). For example, the drift region (in the hvpw 26 region) proximal to the first location 90 is only depleted by the body region under the right-side portion 100. In contrast, the depletion of the drift region proximal to the second location 94 is accomplished by the body regions under the right-side portion 100 and the top portion 104. Accordingly, the BV characteristics and the first location 90 and the second location 94 are different, and correspondingly the required length of the first field flap length 92 and the second field flap length 96 are different. FIG. 4 shows an example embodiment 120 of the combined layers of FIG. 2 and FIG. 3, separately presented for clarity of exposition.

Figure 5:
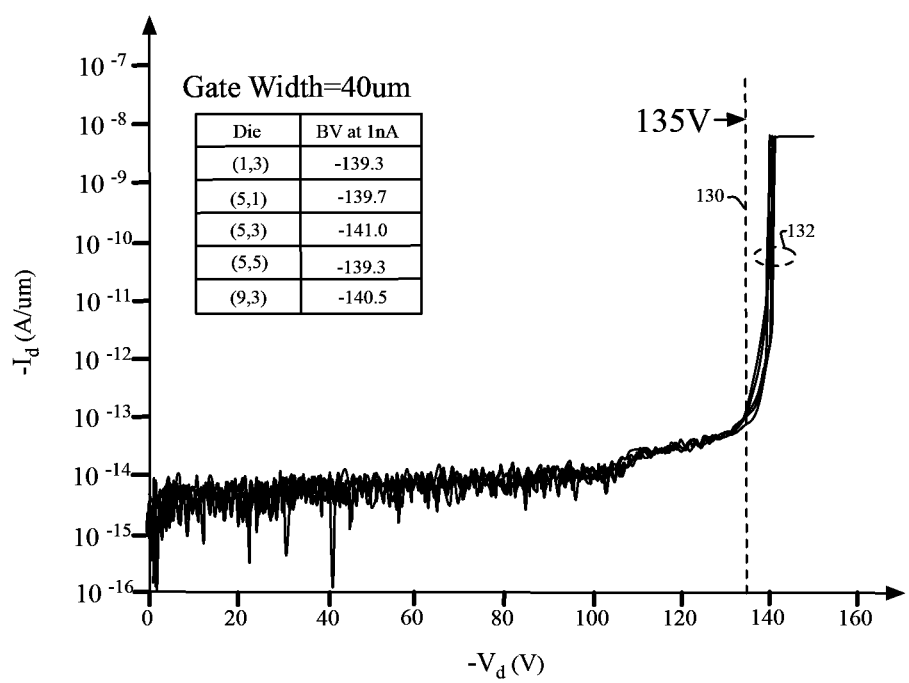
FIG. 5 is a graphical view of the BV characteristics of the example embodiment of FIG. 1 with a device width of 40 µm.
Figure 6:
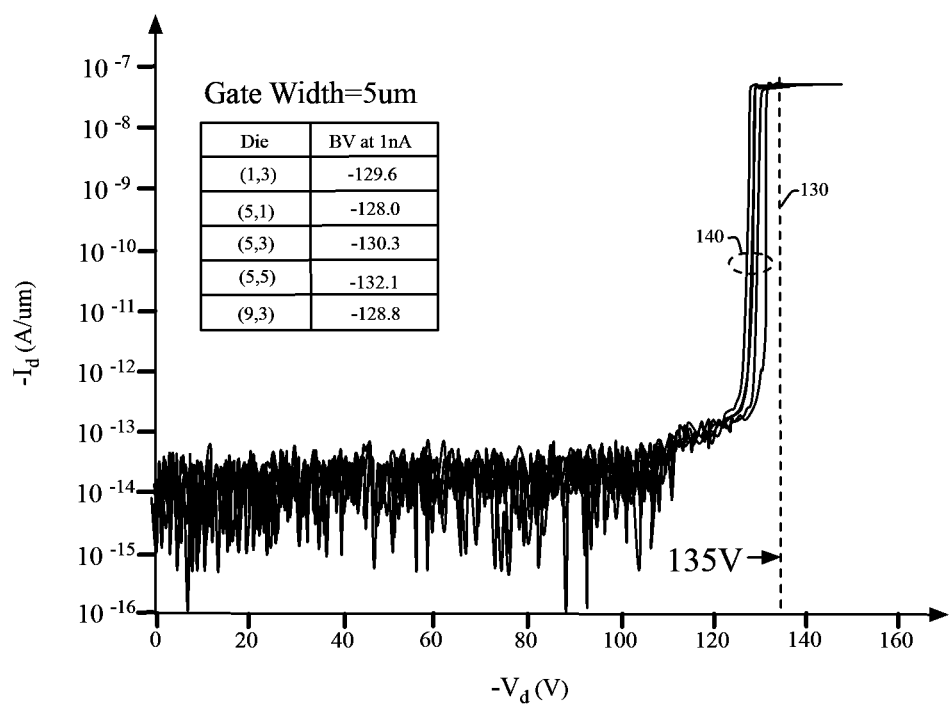
FIG. 6 is a graphical view of the BV characteristics of the example embodiment of FIG. 1 with a device width of 5 µm.

FIG. 5 shows a graphical view of the BV characteristics of the example embodiment 10 with a device width of 40 μm. In the example shown in FIG. 5, the measured BV 132 for five dice exceeds the BV threshold 130 of 135V. The measured BV 132 also shows a tight voltage distribution. However as shown in FIG. 6, as the device width is reduced to 5 μm, the measured BV 140 is reduced below the BV threshold 130 of 135V and exhibits a wider voltage distribution.

Figure 7:
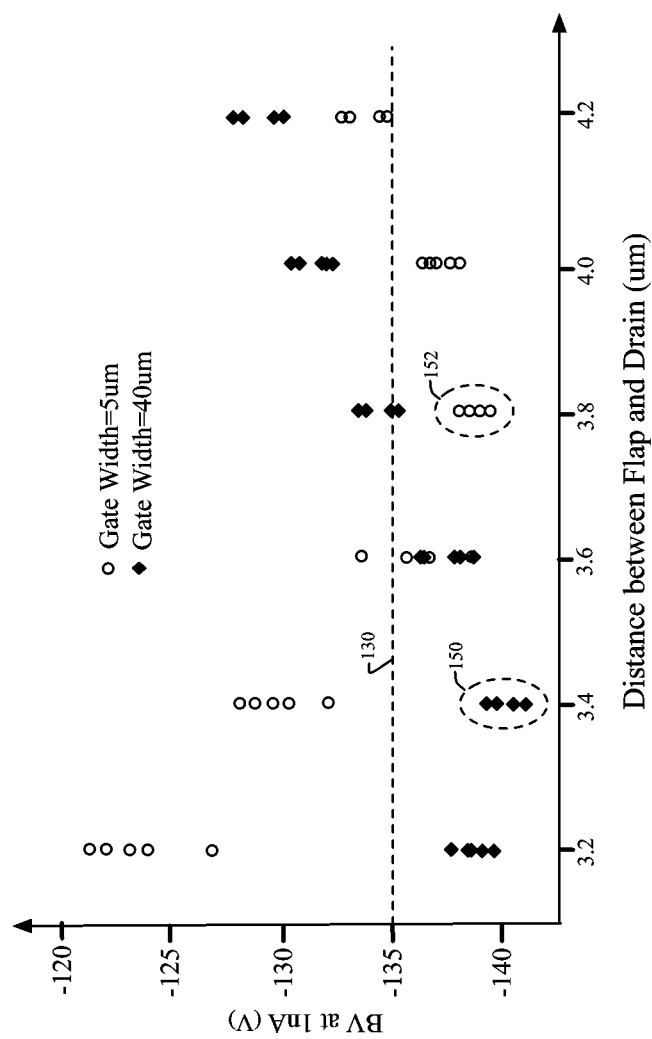
FIG. 7 is a graphical view of the BV characteristics of the LDMOS of FIG. 1 with a modified poly layer having various poly flag to drain spacings, in accordance with example embodiments of the present disclosure.

FIG. 7 is a graphical view of the BV characteristics of the LDMOS of FIG. 1 with a modified poly layer having various poly flag to drain spacings, in accordance with example embodiments of the present disclosure. FIG. 7 compares the BV as a function of the first distance 64 between the poly flap and drain for a device width of 40 μm and 5 μm. In the example embodiments of FIG. 7 for a 40 μm device width an optimal first distance 150 of 3.4 μm is empirically determined that maximizes the BV exceeding the BV threshold 130. For a 5 μm device width, an optimal first distance 152 of 3.8 μm is empirically determined that maximizes the BV exceeding the BV threshold 130. Optimizing the first distance 64 depends upon the device width because the device terminations play a more important role in the narrower device, where the drift region can be fully depleted with an assistance of a shorter poly flap (e.g., a larger flap to drain space, or the first distance 64).

Figure 8:
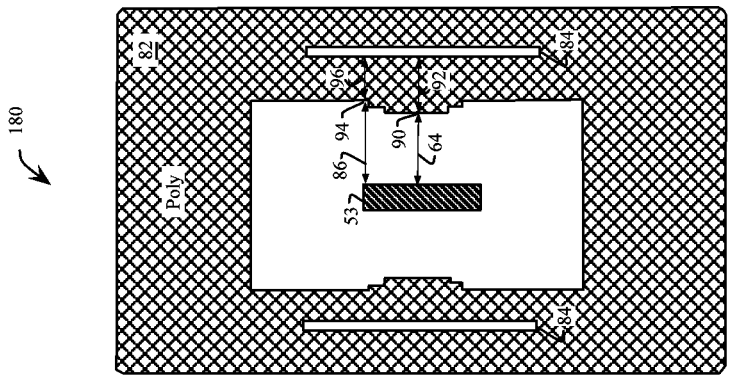
FIG. 8 is a schematic view of a modified polysilicon layer comprising a single stepped flap and a drain region of FIG. 1, in accordance with an example embodiment of the present disclosure.
Figure 9:
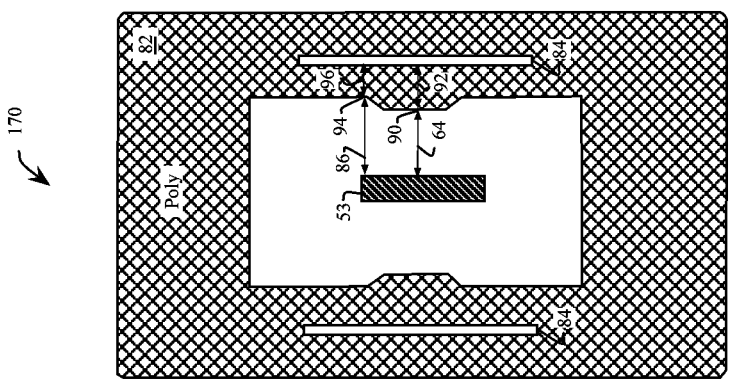
FIG. 9 is a schematic view of a modified polysilicon layer comprising a chamfered flap and a drain region of FIG. 1, in accordance with an example embodiment of the present disclosure.
Figure 10:
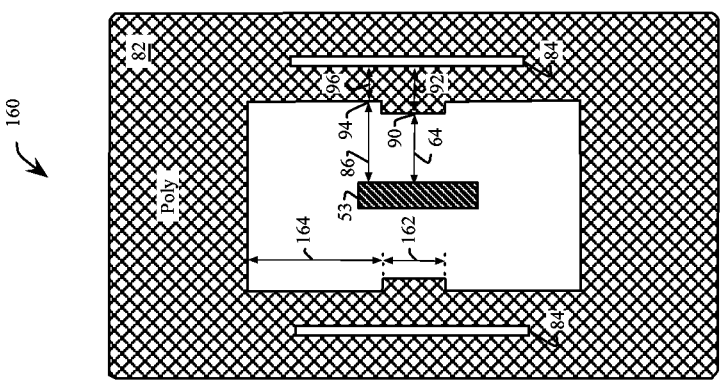
FIG. 10 is a schematic view of a modified poly layer comprising a multiple stepped flap and a drain region of FIG. 1, in accordance with an example embodiment of the present disclosure.

FIG. 8, FIG. 9 and FIG. 10 show three example embodiments 160, 170 and 180 respectively of a modified poly layer having a modified poly flap design to improve BV characteristics. To take in account the impact of device terminations on the device performance, the poly flap of each embodiment is shortened at the terminations and in the area close to the terminations, while the poly flap at the central axis 74 of the active area 72 remains unchanged. Referring to FIG. 8 with reference to FIG. 3 and FIG. 7, an example embodiment of a single stepped flap is shown. As discussed, with regards to FIG. 7, in one embodiment the first distance 64, (and thus the first field flap length 92), is determined empirically. Similarly, in another embodiment, the flap width 162 and flap spacing 164 are determined empirically to maximize the BV exceeding the BV threshold 130. FIG. 9 shows an example embodiment 170, similar to the single stepped flap of embodiment 160 but with a chamfered flap. FIG. 10 shows an example embodiment 180, similar to the single stepped flap of embodiment 160 but with a multiple stepped flap.

Figure 11:
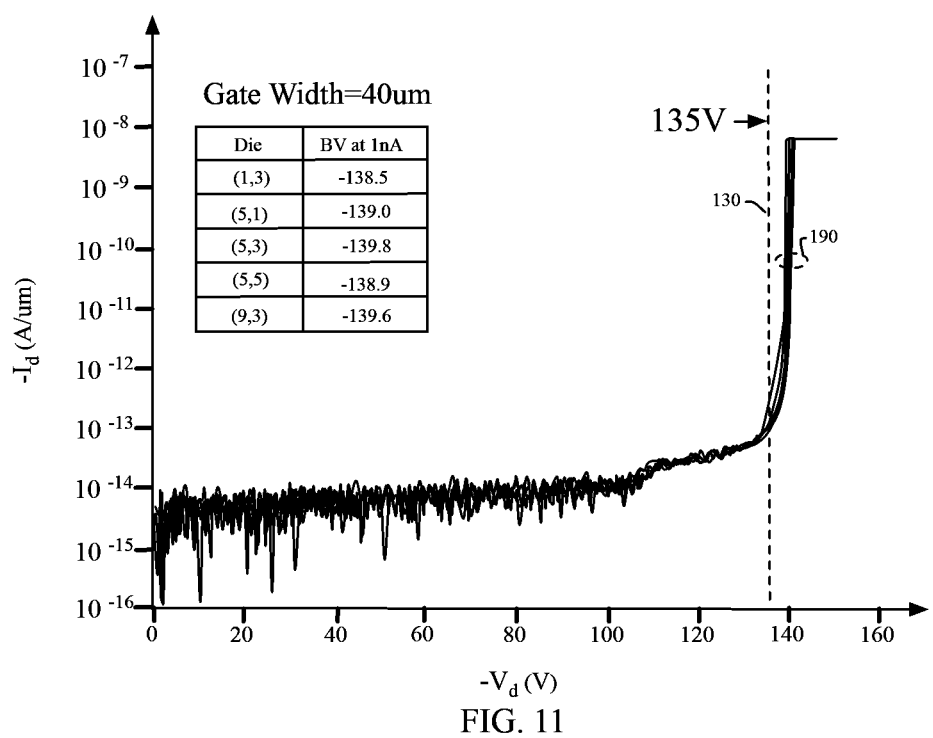
FIG. 11 is a graphical view of the BV characteristics of FIG. 1 with a device width of 40 µm further comprising a poly flap, in accordance with an example embodiment of the present disclosure.
Figure 12:
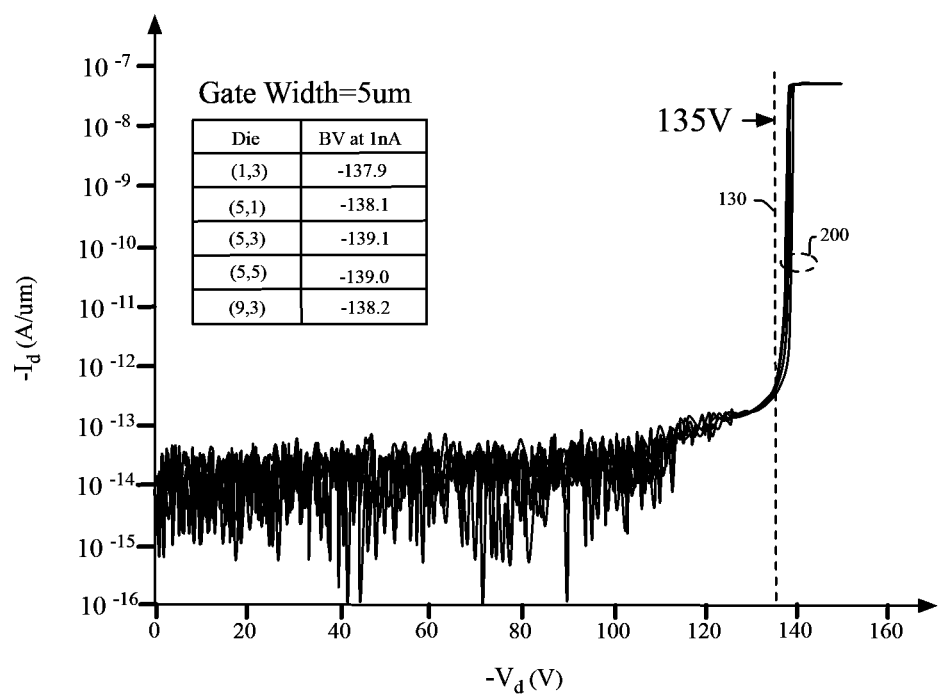
FIG. 12 is a graphical view of the BV characteristics of FIG. 1 with a device width of 5 µm further comprising a poly flap, in accordance with an example embodiment of the present disclosure.

FIG. 11 and FIG. 12 show graphical views of the BV characteristics of the example embodiment 10 with the poly flap of embodiment 160 in FIG. 8. Similar to FIG. 5, the embodiment in FIG. 11 having a device width of 40 μm, shows a measured BV 190 for five dice exceeding the BV threshold 130 of 135V. The measured BV 190 shows a tight voltage distribution, similar to that shown in FIG. 5. In contrast to FIG. 6, the embodiment in FIG. 12 having a device width of 5 μm, shows a measured BV 200 for five dice exceeding the BV threshold 130 of 135V. The measured BV 200 further shows a tight voltage distribution, significantly improved over the distribution shown in FIG. 6.

Figure 13:
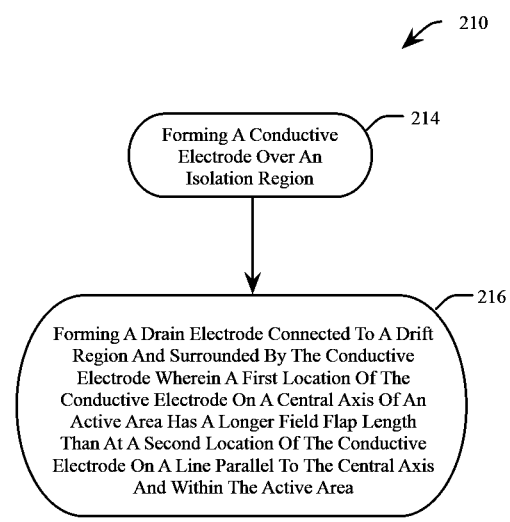
FIG. 13 is a flowchart representation of a method for manufacturing an LDMOS with an improved breakdown performance, in accordance with an example embodiment of the present disclosure.

FIG. 13 shows an example embodiment 210 of a method for manufacturing an LDMOS with an improved breakdown performance. Referring to FIG. 13, with continued reference to FIG. 1 and FIG. 3 at 214, a conductive electrode 54 (e.g., field plate), is formed over an isolation region 50. At 216, a drain electrode 53 is formed and connected to a drift region 26. The drain electrode 53 is surrounded by the conductive electrode 54. A first location 90 of the gate electrode 54 is on a central axis 74 of an active area 72. The conductive electrode 54 has a longer field flap length 92 than at a second location 94 of the conductive electrode 54 on a line parallel to the central axis 74 and within the active area 72.

Figure 14:
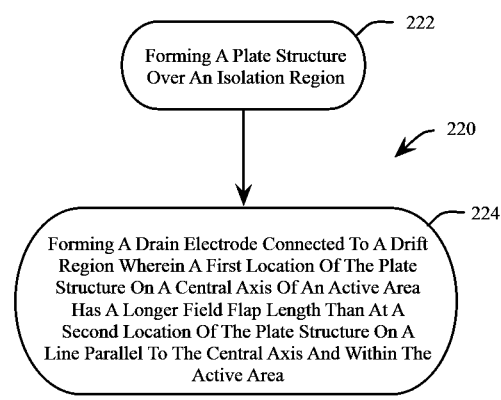
FIG. 14 is a flowchart representation of another method for manufacturing an LDMOS with an improved breakdown performance, in accordance with an example embodiment of the present disclosure.

FIG. 14 shows another example embodiment 220 of a method for manufacturing an LDMOS with an improved breakdown performance. Referring to FIG. 14, with continued reference to FIG. 1 and FIG. 3, at 222, a plate structure 54 is formed over an isolation region 50. A drain electrode 53 is formed and connected to a drift region 26. A first location 90 of the plate structure 54 is on a central axis 74 of an active area 72. The plate structure 54 has a longer field flap length 92 than at a second location 94 of the plate structure 54 on a line parallel to the central axis 74 and within the active area 72.

As will be appreciated, embodiments as disclosed include at least the following. In one embodiment, a method for manufacturing a Laterally Diffused Metal Oxide Semiconductor (LDMOS) comprises forming a conductive electrode over an isolation region. A drain electrode electrically connected to a drift region underlying the isolation region is formed. The conductive electrode surrounds the drain electrode, wherein the drain electrode is separated from a first location of the conductive electrode by a first distance along a central axis of an active area of the LDMOS in a direction of a current flow between a source and a drain of the LDMOS. The drain electrode is separated from a second location of the conductive electrode by a second distance along a line parallel to the central axis and within the active area. The first distance is less than the second distance.

Alternative embodiments of the method for manufacturing a Laterally Diffused Metal Oxide Semiconductor (LDMOS) include one of the following features, or any combination thereof. Manufacturing the LDMOS comprises manufacturing a p-type field effect transistor. Manufacturing the LDMOS comprises manufacturing an n-type field effect transistor. Forming the conductive electrode comprises forming a rectilinear polysilicon flap at the first location, wherein the rectilinear polysilicon flap is not at the second location. Forming the conductive electrode comprises forming a chamfered polysilicon flap at the first location, wherein the chamfered polysilicon flap is not at the second location. Forming the conductive electrode comprises forming a stepped polysilicon flap at the first location, wherein the stepped polysilicon flap is not at the second location. The conductive electrode comprises a polysilicon gate portion connected to a field plate portion in an active area of the LDMOS. The conductive electrode comprises a field plate, wherein the field plate is laterally separated from a conductive gate structure in an active area of the LDMOS.

In another embodiment, an apparatus comprises a conductive electrode over an isolation region. A drain electrode is connected to a drift region underlying the isolation region. The conductive electrode surrounds the drain electrode, wherein the drain electrode is separated from a first location of the conductive electrode by a first distance along a central axis of an active area of an LDMOS in a direction of a current flow between a source and a drain of the LDMOS. The drain electrode is separated from a second location of the conductive electrode by a second distance along a line parallel to the central axis and within the active area. The first distance is less than the second distance.

Alternative embodiments of the apparatus include one of the following features, or any combination thereof. The LDMOS is a p-type field effect transistor. The LDMOS is an n-type field effect transistor. The first location comprises a rectilinear polysilicon flap, wherein the rectilinear polysilicon flap is not at the second location. The first location comprises a chamfered polysilicon flap, wherein the chamfered polysilicon flap is not at the second location. The first location comprises a stepped polysilicon flap, wherein the stepped polysilicon flap is not at the second location. The conductive electrode comprises a polysilicon gate portion connected to a field plate portion in an active area of the LDMOS. The conductive electrode comprises a field plate, wherein the field plate is laterally separated from a conductive gate structure in an active area of the apparatus.

In another embodiment, a method for manufacturing a semiconductor device comprises forming a plate structure over an isolation region. A drain electrode electrically connected to a drift region underlying the isolation region is formed, wherein the drain electrode is separated from a first location of the plate structure by a first distance along a central axis of an active area of the semiconductor device in a direction of a current flow between a source and a drain of the semiconductor device. The drain electrode is separated from a second location of the plate structure by a second distance along a line parallel to the central axis and within the active area. The first distance is less than the second distance.

Alternative embodiments of the method for manufacturing a semiconductor device include one of the following features, or any combination thereof. The plate structure is laterally separated from a conductive electrode in an active area of the semiconductor device. Forming the plate structure comprises forming a rectilinear polysilicon flap at the first location, wherein the rectilinear polysilicon flap is not at the second location. Forming the plate structure comprises forming a chamfered polysilicon flap at the first location, wherein the chamfered polysilicon flap is not at the second location.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for manufacturing a Laterally Diffused Metal Oxide Semiconductor (LDMOS) comprising:

forming a conductive electrode over an isolation region; and forming a drain electrode electrically connected to a drift region underlying the isolation region, the conductive electrode surrounding the drain electrode, wherein the drain electrode is separated from a first location of the conductive electrode by a first distance along a central axis of an active area of the LDMOS in a direction of a current flow between a source and a drain of the LDMOS, the drain electrode is separated from a second location of the conductive electrode by a second distance along a line parallel to the central axis and within the active area, and the first distance being less than the second distance.

2. The method of claim 1 wherein manufacturing the LDMOS comprises manufacturing a p-type field effect transistor.

3. The method of claim 1 wherein manufacturing the LDMOS comprises manufacturing an n-type field effect transistor.

4. The method of claim 1 wherein forming the conductive electrode comprises forming a rectilinear polysilicon flap at the first location, wherein the rectilinear polysilicon flap is not at the second location.

5. The method of claim 1 wherein forming the conductive electrode comprises forming a chamfered polysilicon flap at the first location, wherein the chamfered polysilicon flap is not at the second location.

6. The method of claim 1 wherein forming the conductive electrode comprises forming a stepped polysilicon flap at the first location, wherein the stepped polysilicon flap is not at the second location.

7. The method of claim 1 wherein the conductive electrode comprises a polysilicon gate portion connected to a field plate portion in an active area of the LDMOS.

8. The method of claim 1 wherein the conductive electrode comprises a field plate, wherein the field plate is laterally separated from a conductive gate structure in an active area of the LDMOS.

9. An apparatus comprising:
a conductive electrode over an isolation region; and
a drain electrode connected to a drift region underlying the isolation region, the conductive electrode surrounding the drain electrode, wherein the drain electrode is separated from a first location of the conductive electrode by a first distance along a central axis of an active area of an LDMOS in a direction of a current flow between a source and a drain of the LDMOS, the drain electrode is separated from a second location of the conductive electrode by a second distance along a line parallel to the central axis and within the active area, and the first distance is less than the second distance.

10. The apparatus of claim 9 wherein the LDMOS is a p-type field effect transistor.

11. The apparatus of claim 9 wherein the LDMOS is an n-type field effect transistor.

12. The apparatus of claim 9 wherein the first location comprises a rectilinear polysilicon flap, wherein the rectilinear polysilicon flap is not at the second location.

13. The apparatus of claim 9 wherein the first location comprises a chamfered polysilicon flap, wherein the chamfered polysilicon flap is not at the second location.

14. The apparatus of claim 9 wherein the first location comprises a stepped polysilicon flap, wherein the stepped polysilicon flap is not at the second location.

15. The apparatus of claim 9 wherein the conductive electrode comprises a polysilicon gate portion connected to a field plate portion in an active area of the LDMOS.

16. The apparatus of claim 9 wherein the conductive electrode comprises a field plate, wherein the field plate is laterally separated from a conductive gate structure in an active area of the apparatus.

17. A method for manufacturing a semiconductor device comprising:
forming a plate structure over an isolation region; and
forming a drain electrode electrically connected to a drift region underlying the isolation region, wherein the drain electrode is separated from a first location of the plate structure by a first distance along a central axis of an active area of the semiconductor device in a direction of a current flow between a source and a drain of the semiconductor device, the drain electrode is separated from a second location of the plate structure by a second distance along a line parallel to the central axis and within the active area, and the first distance being less than the second distance.

18. The method of claim 17 wherein the plate structure is laterally separated from a conductive electrode in an active area of the semiconductor device.

19. The method of claim 17 wherein forming the plate structure comprises forming a rectilinear polysilicon flap at the first location, wherein the rectilinear polysilicon flap is not at the second location.

20. The method of claim 17 wherein forming the plate structure comprises forming a chamfered polysilicon flap at the first location, wherein the chamfered polysilicon flap is not at the second location.

* * * * *